(12) United States Patent
Otremba et al.

(10) Patent No.: US 9,123,701 B2
(45) Date of Patent: Sep. 1, 2015

(54) SEMICONDUCTOR DIE AND PACKAGE WITH SOURCE DOWN AND SENSING CONFIGURATION

(71) Applicant: Infineon Technologies Austria AG, Villach (AT)

(72) Inventors: Ralf Otremba, Kaufbeuren (DE); Josef Höglauer, Heimstetten (DE); Gerhard Nöbauer, Villach (AT); Martin Pölzi, Ossiach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/939,894

(22) Filed: Jul. 11, 2013

(65) Prior Publication Data

US 2015/0014858 A1     Jan. 15, 2015

(51) Int. Cl.

| H01L 21/00 | (2006.01) |
| H01L 29/66 | (2006.01) |
| H01L 23/48 | (2006.01) |
| H01L 23/00 | (2006.01) |
| H01L 25/07 | (2006.01) |

(52) U.S. Cl.
CPC .............. *H01L 23/481* (2013.01); *H01L 23/48* (2013.01); *H01L 24/34* (2013.01); *H01L 29/66477* (2013.01); *H01L 25/072* (2013.01); *H01L 2224/05553* (2013.01); *H01L 2224/05554* (2013.01); *H01L 2224/0603* (2013.01); *H01L 2224/48137* (2013.01); *H01L 2224/48247* (2013.01)

(58) Field of Classification Search
CPC ..................... H01L 27/0248; H01L 29/66477; H01L 24/34

USPC .............................. 257/337, 331, 343; 361/57
See application file for complete search history.

(56) References Cited

U.S. PATENT DOCUMENTS

| 6,600,182 | B2 | 7/2003 | Rumennik |
| 7,936,048 | B2 | 5/2011 | Otremba |
| 2002/0190729 | A1* | 12/2002 | Wilson .......................... 324/663 |
| 2009/0212284 | A1 | 8/2009 | Otremba et al. |
| 2009/0250770 | A1* | 10/2009 | Su et al. ........................ 257/401 |
| 2011/0210956 | A1* | 9/2011 | Girdhar et al. ................ 345/212 |
| 2013/0049137 | A1* | 2/2013 | Uno et al. ..................... 257/401 |

FOREIGN PATENT DOCUMENTS

| DE | 102004021054 A1 | 11/2005 |
| DE | 102006012739 B3 | 11/2007 |
| DE | 10 2009 009 874 A1 | 9/2009 |

* cited by examiner

*Primary Examiner* — Caridad Everhart
(74) *Attorney, Agent, or Firm* — Murphy, Bilak & Homiller, PLLC

(57) ABSTRACT

A semiconductor die includes a semiconductor body, a transistor device disposed in the semiconductor body and having a gate, a source and a drain, and a sense device disposed in the semiconductor body and operable to sense a parameter associated with the transistor device. The die further includes a source pad at a first side of the semiconductor body and electrically connected to the source of the transistor device, a drain pad at a second side of the semiconductor body opposing the first side and electrically connected to the drain of the transistor device, and a sense pad at the second side of the semiconductor body and spaced apart from the drain pad. The sense pad is electrically connected to the sense device. A corresponding package and method of manufacturing are also disclosed.

20 Claims, 9 Drawing Sheets

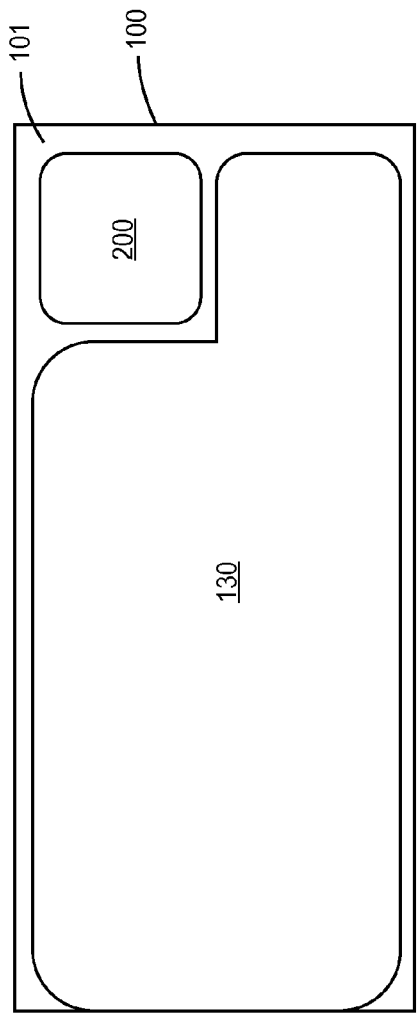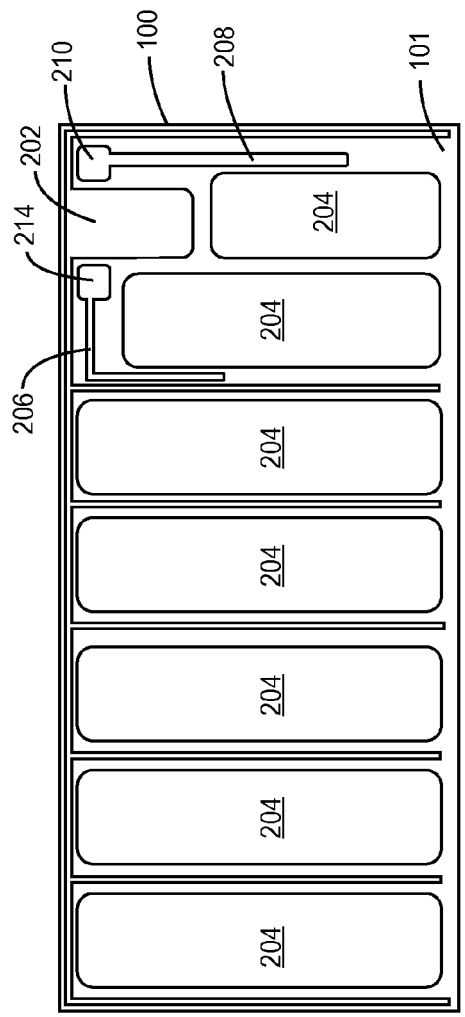
*FIGURE 3A*
*FIGURE 3B*

SEMICONDUCTOR DIE AND PACKAGE WITH SOURCE DOWN AND SENSING CONFIGURATION

TECHNICAL FIELD

The instant application relates to semiconductor dies and corresponding packages, and more particularly to semiconductor dies with sensing and corresponding packages.

BACKGROUND

The drain of a conventional vertical power transistor die is directly connected to a die pad at the backside of the die. The drain pad of the die is directly connected to a drain lead of the package. In many applications, it is desirable to sense the transistor source current or temperature. Conventional techniques for sensing source current or temperature typically involve providing a dedicated sense pad separate from the source pad at the front side of the transistor die. The front side of the die is flipped during the die bond process, and the dedicated source pad is directly soldered or glued. Such a die/package configuration requires a dedicated die pad design for related sensing redistribution, increasing package design complexity and package cost.

SUMMARY

According to an embodiment of a semiconductor die, the semiconductor die comprises a semiconductor body. A transistor device is disposed in the semiconductor body. The transistor device has a gate, a source and a drain. A sense device is also disposed in the semiconductor body. The sense device is operable to sense a parameter associated with the transistor device e.g. such as temperature or source current. A source pad at a first side of the semiconductor body is electrically connected to the source of the transistor device. A drain pad at a second side of the semiconductor body opposing the first side is electrically connected to the drain of the transistor device. A sense pad at the second side of the semiconductor body and spaced apart from the drain pad is electrically connected to the sense device.

According to an embodiment of a method of manufacturing a semiconductor die, the method comprises: forming a transistor device in a semiconductor body, the transistor device having a gate, a source and a drain; forming a sense device in the semiconductor body, the sense device operable to sense a parameter associated with the transistor device; forming a source pad at a first side of the semiconductor body, a drain pad at a second side of the semiconductor body opposing the first side, and a sense pad at the second side of the semiconductor body spaced apart from the drain pad; electrically connecting the source pad to the source of the transistor device; electrically connecting the drain pad to the drain of the transistor device; and electrically connecting the sense pad to the sense device.

According to an embodiment of a semiconductor package, the package comprises a first die paddle and a semiconductor die. The semiconductor die comprises a semiconductor body having a first side facing the first die paddle and a second side facing away from the first die paddle. A transistor device disposed in the semiconductor body has a gate, a source and a drain. A sense device also disposed in the semiconductor body is operable to sense a parameter associated with the transistor device. A source pad at the first side of the semiconductor body is attached to the first die paddle and electrically connected to the source of the transistor device. A drain pad at the second side of the semiconductor body opposing the first side is electrically connected to the drain of the transistor device. A sense pad at the second side of the semiconductor body and spaced apart from the drain pad is electrically connected to the sense device.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings:

FIGS. 3A through 3C illustrate different perspective views of a semiconductor die with a source-down and sensing configuration according to a first embodiment;

DETAILED DESCRIPTION

Embodiments described herein provide a power semiconductor die with a source-down configuration in which the source pad of the die is attached to a die paddle of a package, and the drain pad and a dedicated sense pad are provided at the opposite side of the die. A conductive via can be used to electrically connect the sense device, which can be disposed at the same side of the die as the source of the power transistor, to the dedicated sense pad at the opposite (drain) side of the die. The source-down semiconductor die embodiments described herein reduce switching losses, thereby lowering static losses.

Figure 1:
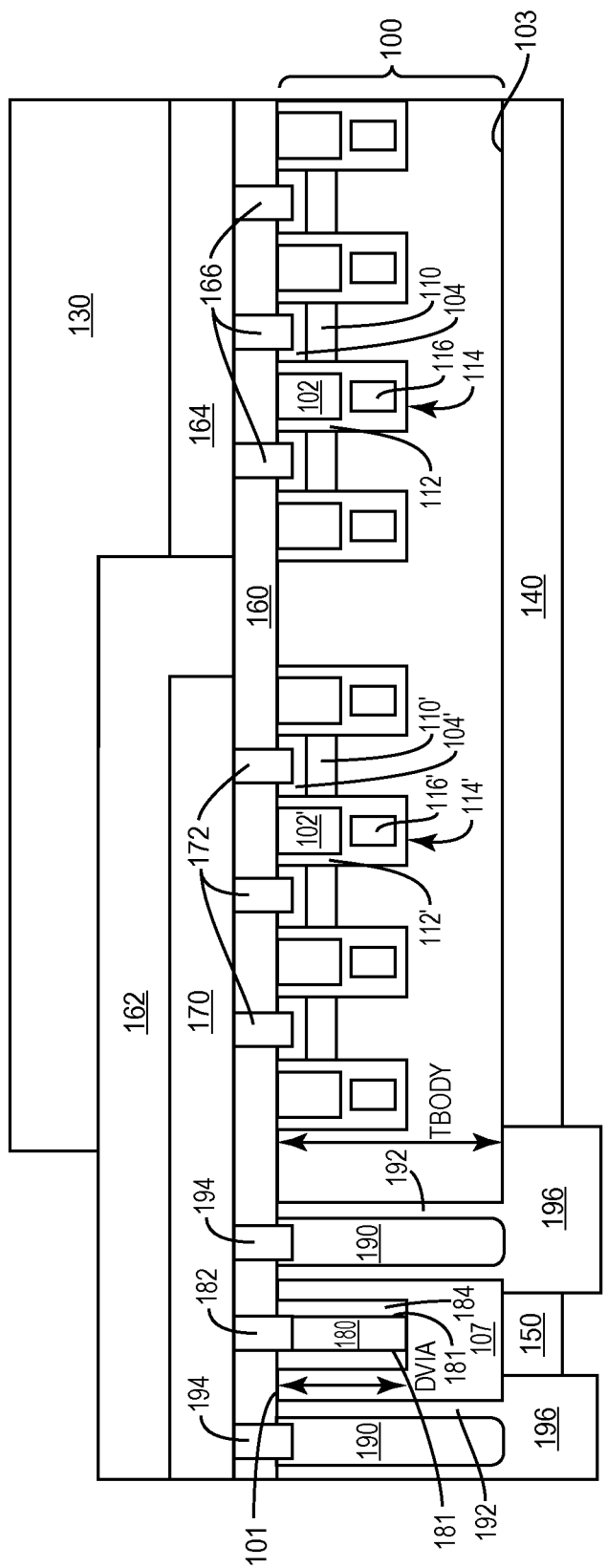
FIG. 1 illustrates a cross-sectional view of an embodiment of a semiconductor die with a source-down and sensing configuration.

FIG. 1 illustrates a partial cross-sectional view of a semiconductor die according to an embodiment. The die includes a semiconductor body 100. The semiconductor body 100 can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaP), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe), to name few.

A transistor device and a sense device are both disposed in the semiconductor body 100. The transistor device has a gate 102, a source 104 and a drain 106. The source 104 is disposed in and separated from a drift region 108 of the transistor device by a body region 110 of the opposite conductivity type. The gate 102 of the transistor device is separated from the surrounding semiconductor material by an insulating material 112 such as SiO2. The transistor device is a trench device according to this embodiment in that the gate 102 is disposed in a trench 114. A field plate 116 separated from the gate 102 by the trench insulating material 112 can be disposed in the trench 114 below the gate 102. Alternatively, the gate 102 can be formed on the top side 101 of the semiconductor body 100 in a planar gate arrangement. In each case, the sense device is operable to sense a parameter associated with the transistor device such as temperature or source current of the transistor device. In one embodiment the sense device is a scaled, smaller version of the transistor device and the corresponding regions of the sense device have the same reference numbers in the Figures as the transistor device with the addition of an apostrophe (').

The semiconductor die further includes a source pad 130 at a first (top) side 101 of the semiconductor body 100, and a drain pad 140 and a dedicated sense pad 150 at a second (bottom) side 103 of the semiconductor body 100 opposing the first side 101. The source pad 130 is electrically connected to the source 104 of the transistor device and the drain pad 140 is electrically connected to the drain 106 of the transistor device. The sense pad 150 is spaced apart from the drain pad 140 at the bottom side 103 of the die, and is electrically connected to the sense device.

In the embodiment shown in FIG. 1, the transistor device is a vertical transistor device. The source 104 is disposed at the top side 101 of the semiconductor body 100 and the drain 106 is disposed at the bottom side 103 of the semiconductor body 100. The source pad 130 is electrically connected to the source 104 at the top side 101 of the semiconductor body 100 by conductive vias (out of view in FIG. 1) which extend from the source pad 130 to the source 104 of the transistor device through an interlayer dielectric layer 160. The drain pad 140 is connected to the drain 106 of the transistor device at the bottom side 103 of the semiconductor body 100. Current flows in the vertical direction through the semiconductor body 100 between the source and drain 104, 106 according to this embodiment. A passivation layer 162 such as an imide can be provided on the semiconductor body 100 at the top side 101. A source metal redistribution layer 164 is connected to the source 104 of the main transistor device by conductive vias 166 which extend through the interlayer dielectric layer 160 separating the source metal redistribution layer 164 from the semiconductor body 100.

In one embodiment, the sense pad 150 is electrically connected to the source 104' of the sense device and the sense device senses the source current of the main transistor device. According to this embodiment, the die includes a source sense metal redistribution layer 170 connected to the source 104' of the sense device by conductive vias 172. The conductive vias 172 extend through the interlayer dielectric layer 160 which separates the sense redistribution layer 170 from the semiconductor body 100.

The source sense metal redistribution layer 170 of the sense device can be electrically connected at the top side 101 of the semiconductor body 100 to the sense pad 150 at the bottom side 103 of the semiconductor body 100 by a first conductive via 180 which extends into the semiconductor body 100 from the top side 101. The first conductive via 180 is aligned with and extends toward the sense pad 150 at the second side 103 of the semiconductor body 100. The semiconductor body 100 has a certain thickness (Tbody), and the first conductive via 180 extends to a depth (Dvia) in the semiconductor body 100 that is less than the thickness of the body 100. As such, the first conductive via 180 is spaced apart from the sense pad 150 in the vertical direction by a highly doped region 107 of the semiconductor body 100. The vertical direction is generally perpendicular to the main sides 101, 103 of the semiconductor body 100. The source sense metal redistribution layer 170 of the sense device is connected to the first conductive via 180 by a conductive via 182 that extends through the interlayer dielectric layer 160 which separates the sense redistribution layer 170 from the semiconductor body 100. The sense pad 150 is electrically connected to the source sense metal redistribution layer 170 of the sense device at the top side 101 of the semiconductor body 100 by the first conductive via 180 and the highly doped region 107 of the semiconductor body 100 interposed between the first conductive via 180 and the sense pad 150. The sides 181 of the first conductive via 180 can be insulated from the surrounding semiconductor material by an insulating material 184 such as an oxide. In one embodiment, the semiconductor body 100 comprises silicon and the first conductive via 180 is a so-called silicon through via comprising polysilicon or metal.

At least one additional conductive via 190 can be provided which extends through the semiconductor body 100 from the first side 101 to the second side 103 and is spaced apart from the first conductive via 180. The additional conductive via(s) 190 extend over the entire thickness (Tbody) of the semiconductor body 100, and are insulated from the surrounding semiconductor material by an insulating material 192 such as an oxide. The additional conductive via(s) 190 provide device isolation. To this end, the additional conductive via(s) 190 can be connected to the sense redistribution layer 170 at the top side 101 of the semiconductor body 100 through conductive vias 194 extending through the interlayer dielectric layer 160. In one embodiment, the semiconductor body 100 comprises silicon and the additional conductive via(s) 190 are so-called silicon through vias comprising polysilicon or metal.

In the embodiment shown in FIG. 1, the sense pad 150 is insulated from the additional conductive via(s) 190 at the second side 103 of the semiconductor body 100 by an insulating material 196 such as an oxide. The insulating material 196 also separates the sense pad 150 from the drain pad 140.

Figure 2:
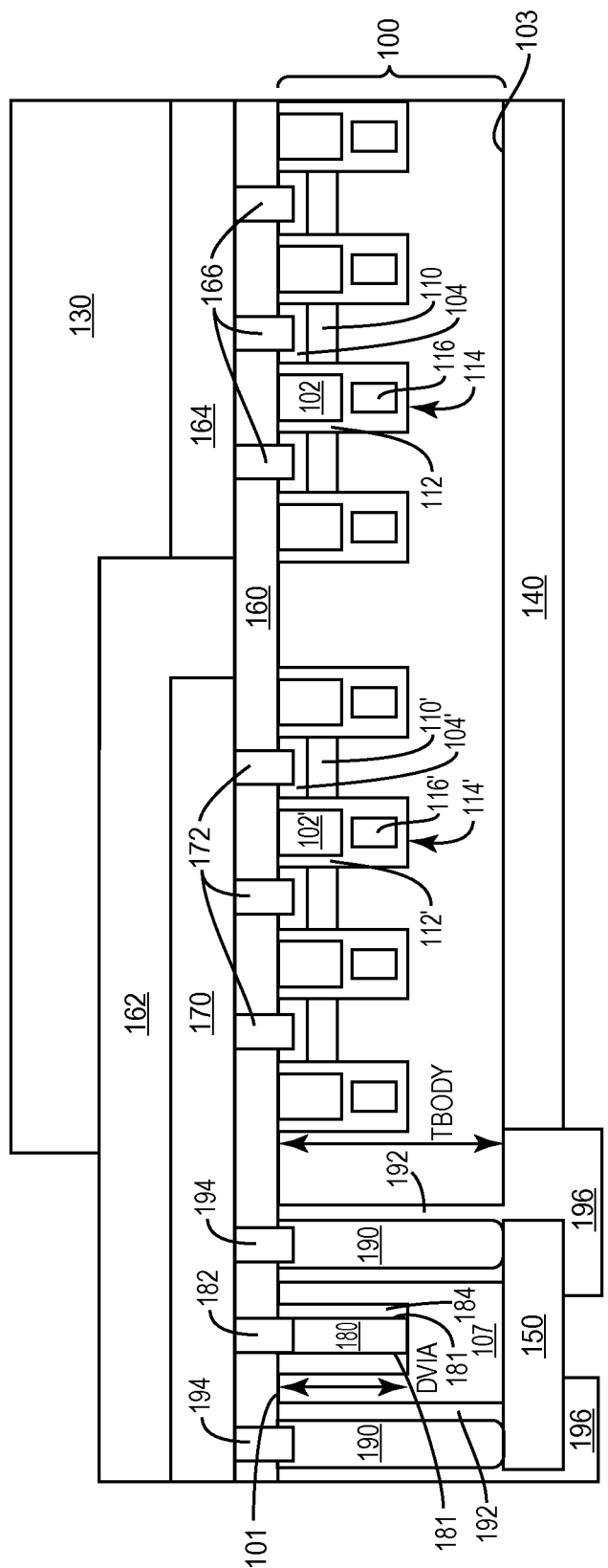
FIG. 2 illustrates a cross-sectional view of another embodiment of a semiconductor die with a source-down and sensing configuration.

FIG. 2 illustrates a partial cross-sectional view of a semiconductor die according to another embodiment. The embodiment shown in FIG. 2 is similar to the embodiment shown in FIG. 1, however the sense pad 150 at the bottom side 103 of the semiconductor body 101 also contacts the additional conductive via(s) 190 at the bottom side 103 of the body 100.

Figure 3C:
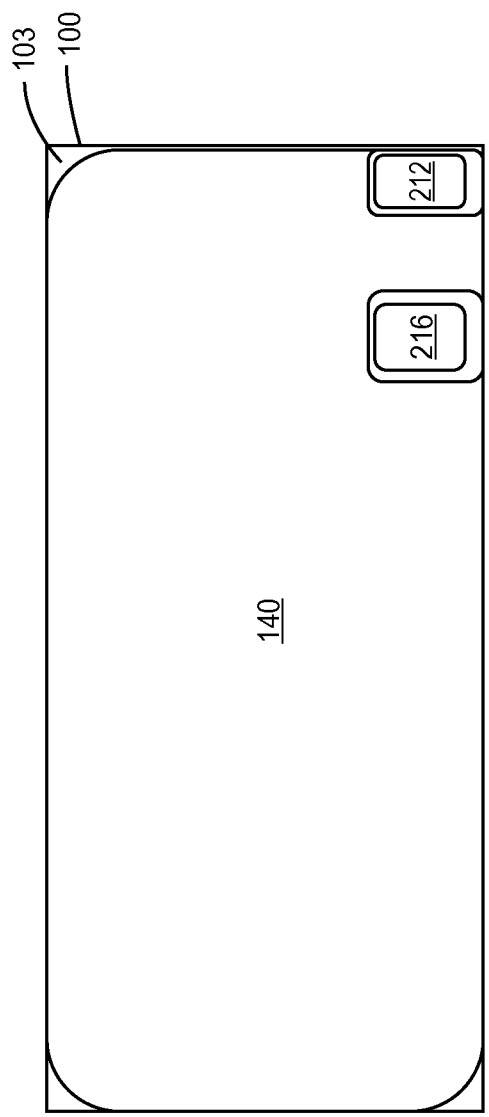

FIGS. 3A through 3C illustrate different perspective views of the semiconductor die shown in FIG. 1 or 2. FIG. 3A illustrates a top plan view of the semiconductor die, FIG. 3B shows the top plan view without die pads and interlayer dielectrics, and FIG. 3C shows a bottom plan view of the semiconductor die. According to this embodiment, a gate pad 200 is provided at the top side of the semiconductor body 100 and spaced apart from the source pad 130. The gate pad 200 is electrically connected to the gate 102 of the main transistor device. In FIG. 3B, the gate pad is connected to a gate metal redistribution layer 202 which is separate (isolated) from the source sense metal redistribution layer 170 of the sense device. Electrical connections to the gate 102 of the main transistor device are formed by conductive vias (not shown for ease of illustration) which extend from the gate metal redistribution layer 202 to the transistor gate 102 through the interlayer dielectric layer 160 that separates the gate metal redistribution layer 202 from the semiconductor body 100.

Also shown in FIG. 3B is the source metal redistribution layer 204 (region 164 in FIGS. 1 and 2) which is connected to the source 104 of the main transistor device by conductive vias (region 172 in FIGS. 1 and 2) which extend from the source metal redistribution layer 204 to the transistor source 104 through the interlayer dielectric layer 160. Also shown are a sensing line 206 and a tapping line 208 of the sense device. In the case of the sense device being a scaled and smaller version of the transistor device and the sense device being operable to sense the source current of the transistor device, the sensing line 206 is connected to the source 104' of the smaller sense transistor and the tapping line 208 is connected to the source potential of the larger main transistor device. The sensing line 206 can have the same or similar construction as the source sense metal redistribution layer 170 shown in FIGS. 1 and 2. The tapping line 208 can have the same or similar construction as the sensing line 206, except the tapping line is connected to the source potential of the main transistor device instead of the source 104' of the sense device.

A first conductive via 210 extends into the semiconductor body 100 from the top side 101 toward a first sense pad 212 at the bottom side 103 of the semiconductor body 100 as shown in FIG. 3C. The first conductive via 210 can have the same or similar construction as via 180 shown in FIGS. 1 and 2, and the first sense pad 212 can have the same or similar construction as sense pad 150 shown in FIGS. 1 and 2. The first sense 212 pad is electrically connected to the tapping line 208 by the first conductive via 210 and the highly doped region of the semiconductor body 100 vertically interposed between the first conductive via 210 and the first sense pad 212 as previously described herein.

A second conductive via 214 similarly extends into the semiconductor body 100 from the top side 101 toward a second sense pad 216 at the bottom side 103 of the semiconductor body 100 as shown in FIG. 3C. The second conductive via 214 can have the same or similar construction as via 180 shown in FIGS. 1 and 2, and the first sense pad 212 can have the same or similar construction as sense pad 150 shown in FIGS. 1 and 2. The second sense 216 pad is electrically connected to the sensing line 206 by the second conductive via 214 and the highly doped region of the semiconductor body 100 vertically interposed between the second conductive via 214 and the second sense pad 216 as previously described herein. The die pad 140 and the sense pads 212, 216 are isolated from one another at the bottom side 103 of the semiconductor body 100 e.g. by a passivation layer such as an imide which is not shown in FIG. 3C for ease of illustration (see for example layer 196 in FIGS. 1 and 2).

Figure 4A:
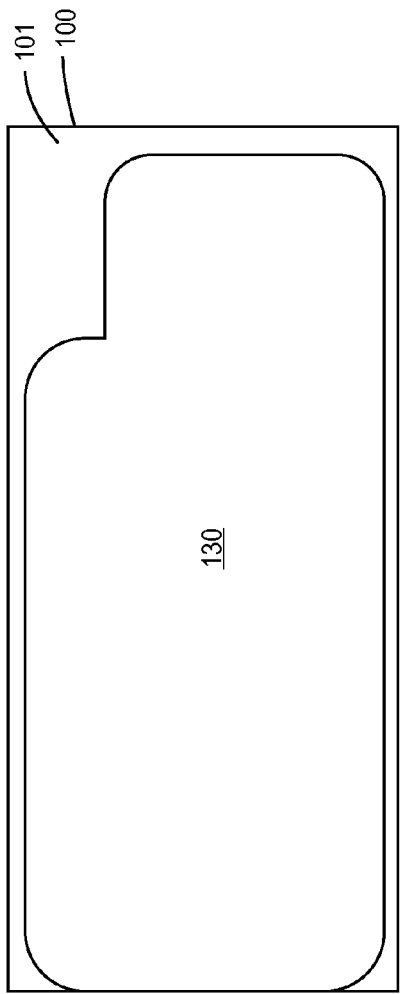
FIGS. 4A through 4C illustrate different perspective views of a semiconductor die with a source-down and sensing configuration according to a second embodiment.
Figure 4B:
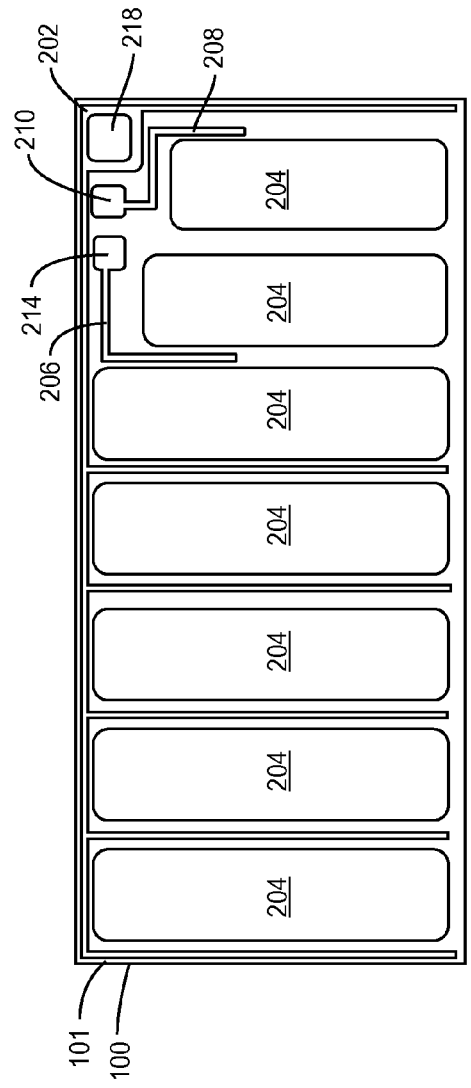
Figure 4C:
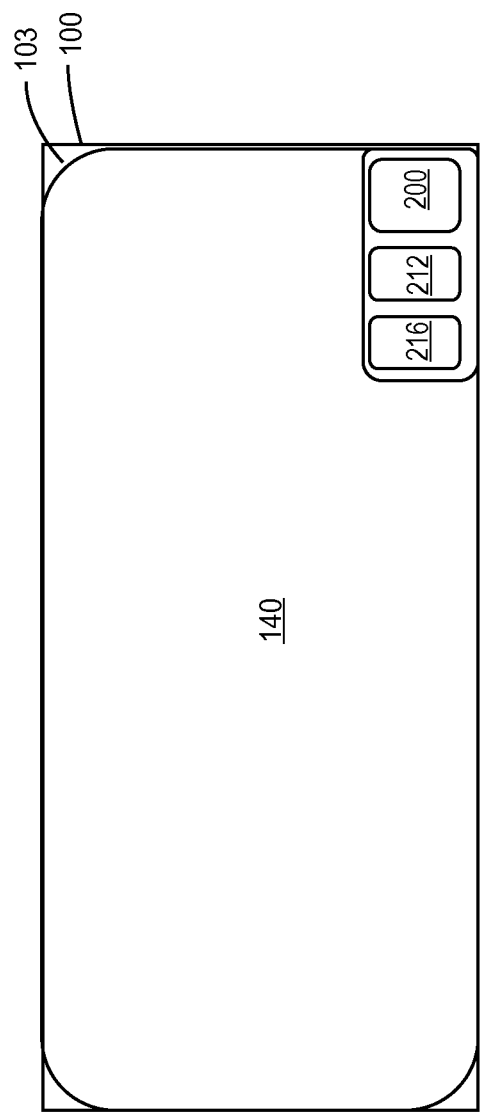

FIGS. 4A through 4C illustrate different perspective view of the semiconductor die shown in FIG. 1 or 2, according to yet another embodiment. FIG. 4A illustrates a top plan view of the semiconductor die, FIG. 4B shows the top plan view without die pads and interlayer dielectrics, and FIG. 4C shows a bottom plan view of the semiconductor die. The embodiment shown in FIGS. 4A through 4C is similar to the embodiment shown in FIGS. 3A through 3C, however the gate pad 200 is provided at the bottom side 103 of the semiconductor body 100 with the drain pad 140 and sense pads 212, 216 instead of at the top side 101 of the semiconductor body 100 with the source pad 130. To this end, an additional conductive via 218 is provided for connecting gate metal redistribution layer 202 at the top side 101 of the semiconductor body 100 with the gate pad 200 at the bottom side 103 of the semiconductor body 100 as shown in FIGS. 4B and 4C.

According to this embodiment, only the source pad 130 is disposed at the top side 101 of the semiconductor body 100 as shown in FIG. 4A. The drain pad 140, gate pad 200 and sense pads 212, 216 are each provided at the bottom side 103 of the semiconductor body 100 and isolated from one another e.g. by a passivation layer such as an imide which is not shown in FIG. 4C for ease of illustration (see for example layer 196 in FIGS. 1 and 2).

A method of manufacturing the semiconductor dies described herein comprises: forming a transistor device in a semiconductor body, the transistor device having a gate, a source and a drain; forming a sense device in the semiconductor body, the sense device operable to sense a parameter associated with the transistor device; forming a source pad at a first side of the semiconductor body, a drain pad at a second side of the semiconductor body opposing the first side, and a sense pad at the second side of the semiconductor body spaced apart from the drain pad; electrically connecting the source pad to the source of the transistor device; electrically connecting the drain pad to the drain of the transistor device; and electrically connecting the sense pad to the sense device.

The sense pad can be electrically connected to the sense device by forming a first conductive via extending into the semiconductor body from the first side and spaced apart from the sense pad by a highly doped region of the semiconductor body. The sense pad is electrically connected to the sense device by the first conductive via and the highly doped region of the semiconductor body interposed between the first conductive via and the sense pad.

An additional sense pad can be formed at the second side of the semiconductor body and spaced apart from the other sense pad and the drain pad. The additional sense pad can be electrically connected to the source of the transistor device, e.g., by forming a conductive via extending into the semiconductor body from the first side and spaced apart from the additional sense pad by a highly doped region of the semiconductor body. The additional sense pad is electrically connected to the source of the transistor device by the conductive via and the highly doped region of the semiconductor body interposed between the conductive via and the additional sense pad.

The semiconductor dies described herein can be assembled into a package. When assembling the semiconductor die into a package, the source-side of the die is placed face down in the package so that the pad is attached to a die paddle of the package. The drain pad and sense pads face away from the die paddle. The gate pad can be at the source-side or drain-side of the die as previously described herein.

Figure 5:
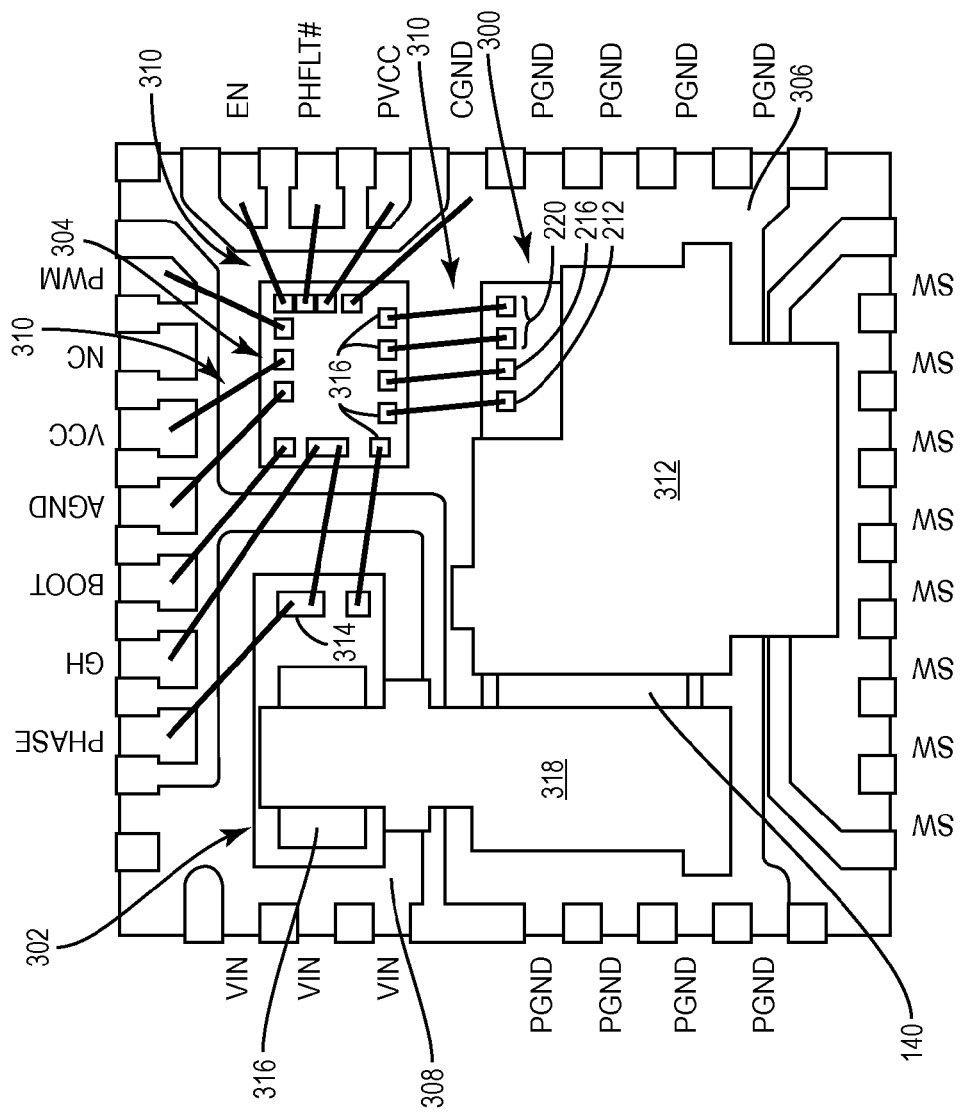
FIG. 5 illustrates a top plan view of an embodiment of a semiconductor package including a semiconductor die with a source-down and sensing configuration.
Figure 6:
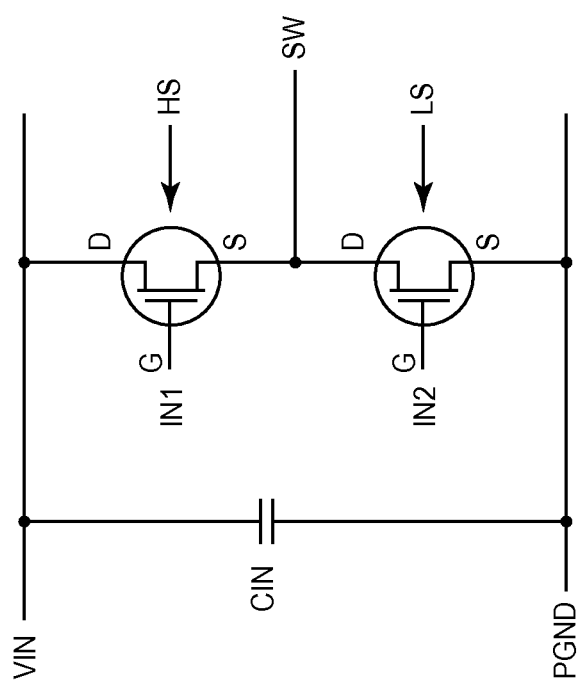
FIG. 6 illustrates a circuit schematic of an exemplary half-bridge circuit.

FIG. 5 illustrates a top plan view of a semiconductor package which includes the semiconductor die 300 shown in FIGS. 4A through 4C and additional semiconductor dies 302, 304. For ease of explanation and illustration only certain package parts such as a lid and mold compound or other encapsulating material are not shown, and the circuit realized by the components included in the package of FIG. 5 is a half-bridge converter circuit as shown in FIG. 6. The half-bridge circuit includes a low-side transistor (LS) corresponding to die 300, a high-side transistor (HS) die corresponding to die 302 and an input capacitor (Cin) coupled between the positive input (VIN) and the negative input (PGND) of the half-bride circuit. The negative input can be ground in some configurations. The low-side transistor LS corresponds to the semiconductor die 300 shown in FIGS. 4A through 4C in that the gate pad 200 and source pad 130 are disposed at the same side of the die 300. In the exemplary circuit diagram shown in FIG. 6, the transistors are MOSFETs each having gate (G), drain (D) and source (S) terminals.

The gate, drain and source terminals of the low-side transistor LS correspond to the gate, drain and source pads 200, 140, 130 shown in FIGS. 4A through 4C, respectively. The drain terminal of the high-side transistor HS is electrically connected to the positive input (VIN) of the half-bridge circuit. The source terminal of the high-side transistor HS is electrically connected to the drain terminal of the low-side transistor LS to form the output (SW) of the half-bridge circuit. The source terminal of the low-side transistor LS is electrically connected to the negative input (PGND). The transistor gates (G) serve as control signal inputs (IN1, IN2). IGBTs can be used instead of MOSFETs where the collector connections of the IGBTs would correspond to the drain connections of the MOSFETs and the emitter connections of the IGBTs would correspond to the source connections of the MOSFETs. The package also includes a controller die 304 with various (signal and power) inputs and outputs (e.g., PHASE, GL, BOOT, AGND, VCC, PWM, EN, PHFLT#, PVCC, CGND, GL) for controlling operation of the half-bridge circuit. In general the type and number of semiconductor dies included in the package depends on the particular application for which the package is designed, and the inter-die interconnect embodiments described herein can be used in each case.

The package also includes a first die paddle 306 and a second die paddle 308. The source pad 130 of the low-side transistor die 300 is attached to the first die paddle 306 and electrically connected to the source terminal of the low-side transistor LS included in the die 300. The controller die 304 also has a pad facing and connected to the first die paddle 306. The drain pad 140 of the low-side transistor die 300 is disposed at the opposite side of the die 300 facing away from the first die paddle 306. The drain pad 140 is electrically connected to the drain (D) of the low-side transistor. The sense pads 212, 216 and gate pad 300 are disposed at the same side of the die 300 as the drain pad 140, and spaced apart from the drain pad 140. Hence only the source pad 130 of the low-side transistor die 300 faces the first die paddle 306. Bond wire connections 310 connect the gate and sense pads 200, 212, 216 of the low-side transistor die 300 to the controller die 304. The drain pad 140 of the low-side transistor die 300 is connected to an output lead (SW) of the package by a metal clip 312.

The drain pad (out of view) of the high-side transistor die 302 is connected to the second die paddle 308 of the package. Bond wire connections 310 are provided between the gate pad 314 of the high-side transistor die 302 and one or more corresponding pads 316 of the controller die 304. Bond wire connections 310 are also provided between various leads of the package and the dies 300, 302, 304. The source pad 316 of the high-side transistor die 302 faces away from the second die paddle 308 and is connected to the drain pad 140 of the low-side transistor die 300 by a metal clip 318 to form the half-bridge circuit connections shown in FIG. 6 (the input capacitor Cin is omitted from FIG. 5 for ease of illustration). The gate pad 200 of the low-side transistor die 300 is disposed at the same side of the die 300 as the drain and sense pads 140, 212, 216 according to the embodiment of FIG. 6. As such, the gate pad 200 of the low-side transistor die 300 faces away the first die paddle 306. The gate pad 200 of the low-side transistor die 300 is connected to a corresponding pad 316 of the controller die 304 by one or more bond wire connections 310.

Figure 7:
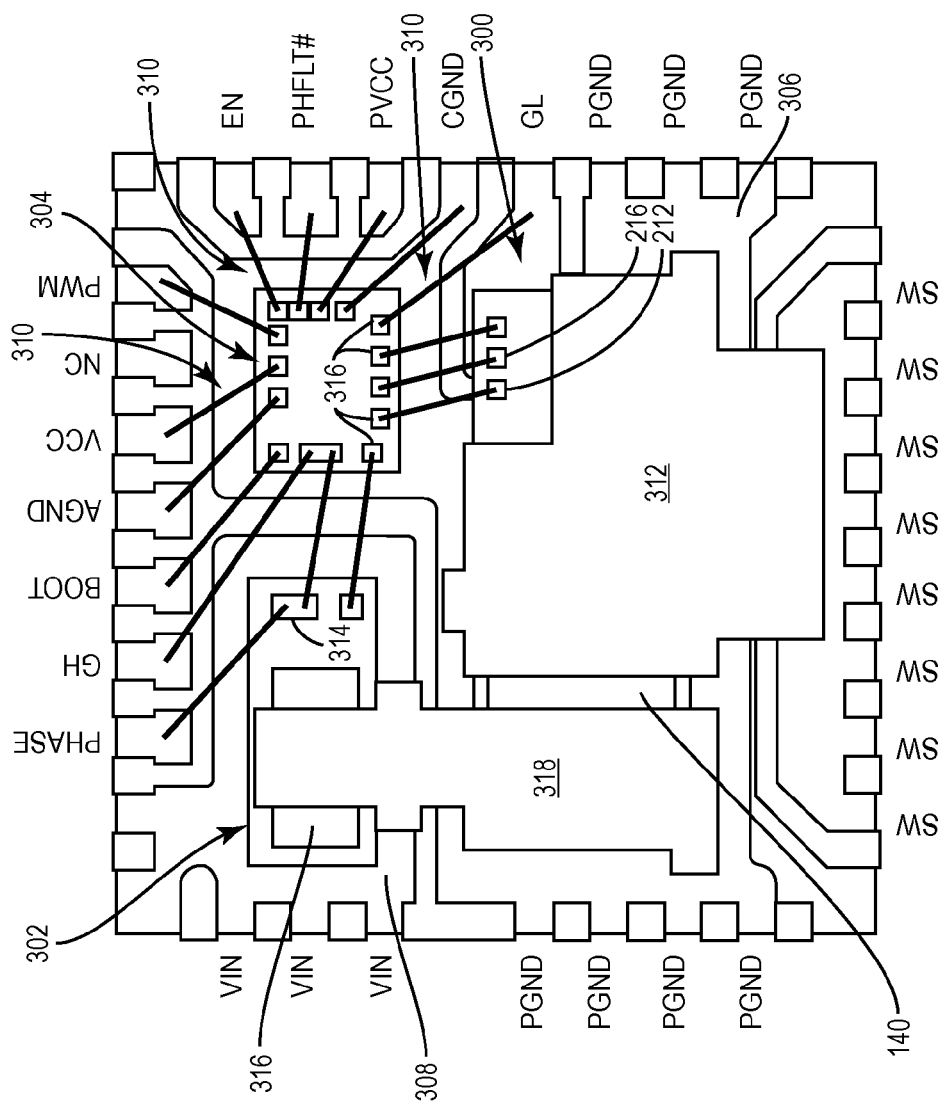
FIG. 7 illustrates a top plan view of another embodiment of a semiconductor package including a semiconductor die with a source-down and sensing configuration.

FIG. 7 illustrates a top plan view of another embodiment of a semiconductor package which is similar to the embodiment shown in FIG. 5, however the low-side transistor die 300 corresponds to the semiconductor die shown in FIGS. 3A through 3C instead of FIGS. 4A through 4C. The gate pad 200 of the low-side transistor die 300 is disposed at the same side of the die as the source pad 130 according to this embodiment. As such, the gate pad 200 of the low-side transistor die faces toward the first die paddle 306 according to this embodiment. The gate pad 200 is spaced apart from the source pad 130 and attached to a lead (GL) of the package in the same plane as the first die paddle 306. In both FIG. 5 and FIG. 7, the low-side transistor die is attached to the die paddle of the package in a source-down configuration with sensing.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor die, comprising:
   a semiconductor body;
   a transistor device disposed in the semiconductor body and having a gate, a source and a drain;
   a sense device disposed in the semiconductor body and operable to sense a parameter associated with the transistor device;
   a source pad at a first side of the semiconductor body and electrically connected to the source of the transistor device;
   a drain pad at a second side of the semiconductor body opposing the first side and electrically connected to the drain of the transistor device;
   a sense pad at the second side of the semiconductor body and spaced apart from the drain pad, the sense pad electrically connected to the sense device; and
   a gate pad at one of the first side or the second side of the semiconductor body, the gate pad being electrically connected to the gate of the transistor device, the gate pad being spaced apart from the sense pad and the drain pad if disposed at the second side, the gate pad being spaced apart from the source pad if disposed at the first side.

2. The semiconductor die of claim 1, wherein the transistor device is a vertical transistor device, the source is disposed at the first side of the semiconductor body, the drain is disposed at the second side of the semiconductor body, the source pad is connected to the source at the first side of the semiconductor body, and the drain pad is connected to the drain at the second side of the semiconductor body.

3. The semiconductor die of claim 1, further comprising a first conductive via extending into the semiconductor body from the first side and spaced apart from the sense pad by a highly doped region of the semiconductor body, wherein the sense pad is electrically connected to the sense device by the first conductive via and the highly doped region of the semiconductor body interposed between the first conductive via and the sense pad.

4. The semiconductor die of claim 3, further comprising at least one additional conductive via extending through the semiconductor body from the first side to the second side and spaced apart from the first conductive via.

5. The semiconductor die of claim 4, wherein the sense pad contacts the at least one additional conductive via at the second side of the semiconductor body.

6. The semiconductor die of claim 4, wherein the sense pad is insulated from the at least one additional conductive via at the second side of the semiconductor body.

7. The semiconductor die of claim 3, further comprising:
an insulating layer on the first side of the semiconductor body;
a metal layer on the insulating layer; and
a conductive via extending through the insulating layer and electrically connecting the metal layer to the first conductive via.

8. The semiconductor die of claim 7, wherein the source pad is connected to the metal layer and the sense device is operable to sense current at the source of the transistor device.

9. The semiconductor die of claim 3, wherein the semiconductor body comprises silicon and the first conductive via comprises polysilicon or metal.

10. The semiconductor die of claim 1, further comprising an additional sense pad at the second side of the semiconductor body and spaced apart from the other sense pad and the drain pad, the additional sense pad electrically connected to the source of the transistor device.

11. The semiconductor die of claim 10, further comprising a conductive via extending into the semiconductor body from the first side and spaced apart from the additional sense pad by a highly doped region of the semiconductor body, wherein the additional sense pad is electrically connected to the source of the transistor device by the conductive via and the highly doped region of the semiconductor body interposed between the conductive via and the additional sense pad.

12. A method of manufacturing a semiconductor die, the method comprising:
forming a transistor device in a semiconductor body, the transistor device having a gate, a source and a drain;
forming a sense device in the semiconductor body, the sense device operable to sense a parameter associated with the transistor device;
forming a source pad at a first side of the semiconductor body, a drain pad at a second side of the semiconductor body opposing the first side, and a sense pad at the second side of the semiconductor body spaced apart from the drain pad;
forming a gate pad at one of the first side or the second side of the semiconductor body, the gate pad being spaced apart from the sense pad and the drain pad if disposed at the second side, the gate pad being spaced apart from the source pad if disposed at the first side;
electrically connecting the gate pad to the gate of the transistor device;
electrically connecting the source pad to the source of the transistor device;
electrically connecting the drain pad to the drain of the transistor device; and
electrically connecting the sense pad to the sense device.

13. The method of claim 12, wherein electrically connecting the sense pad to the sense device comprises:
forming a first conductive via extending into the semiconductor body from the first side and spaced apart from the sense pad by a highly doped region of the semiconductor body, the sense pad being electrically connected to the sense device by the first conductive via and the highly doped region of the semiconductor body interposed between the first conductive via and the sense pad.

14. The method of claim 12, further comprising:
forming an additional sense pad at the second side of the semiconductor body and spaced apart from the other sense pad and the drain pad; and
electrically connecting the additional sense pad to the source of the transistor device.

15. The method of claim 14, wherein electrically connecting the additional sense pad to the source of the transistor device comprises:
forming a conductive via extending into the semiconductor body from the first side and spaced apart from the additional sense pad by a highly doped region of the semiconductor body, the additional sense pad being electrically connected to the source of the transistor device by the conductive via and the highly doped region of the semiconductor body interposed between the conductive via and the additional sense pad.

16. A semiconductor package, comprising:
a first die paddle; and
a semiconductor die comprising:
a semiconductor body having a first side facing the first die paddle and a second side facing away from the first die paddle;
a transistor device disposed in the semiconductor body and having a gate, a source and a drain;
a sense device disposed in the semiconductor body and operable to sense a parameter associated with the transistor device;
a source pad at the first side of the semiconductor body, the source pad attached to the first die paddle and electrically connected to the source of the transistor device;
a drain pad at the second side of the semiconductor body opposing the first side and electrically connected to the drain of the transistor device; and
a sense pad at the second side of the semiconductor body and spaced apart from the drain pad, the sense pad electrically connected to the sense device.

17. The semiconductor package of claim 16, further comprising an additional sense pad at the second side of the semiconductor body and spaced apart from the other sense pad and the drain pad, the additional sense pad electrically connected to the source of the transistor device.

18. The semiconductor package of claim 16, further comprising a gate pad at the second side of the semiconductor body and spaced apart from the sense pad and the drain pad, the gate pad electrically connected to the gate of the transistor device.

19. The semiconductor package of claim 16, further comprising:
an electrically conductive lead in the same plane as the first die paddle; and
a gate pad at the first side of the semiconductor body and spaced apart from the source pad, the gate pad attached to the lead and electrically connected to the gate of the transistor device.

20. The semiconductor package of claim 16, wherein the semiconductor die is a low-side power transistor die of a half-bridge circuit, the semiconductor package further comprising:
a controller die having a first pad attached to the first die paddle and a plurality of additional pads at a side of the controller die facing away from the first die paddle, the controller die operable to control operation of the half-bridge circuit;
a second die paddle spaced apart from the first die paddle; and
a high-side power transistor die of the half-bridge circuit, the high-side power transistor die having a drain pad attached to the second die paddle, a gate pad electrically connected to a first one of the additional terminals of the controller die, and a source pad electrically connected to the drain pad of the low-side power transistor die.

* * * * *

UNITED STATES PATENT AND TRADEMARK OFFICE
CERTIFICATE OF CORRECTION

PATENT NO. : 9,123,701 B2  
APPLICATION NO. : 13/939894  
DATED : September 1, 2015  
INVENTOR(S) : Otremba et al.

Page 1 of 1

It is certified that error appears in the above-identified patent and that said Letters Patent is hereby corrected as shown below:

Title Page/Inventors (72) line 3, please change "Martin Pölzi" to -- Martin Pölzl --

Signed and Sealed this  
Third Day of May, 2016

Michelle K. Lee  
*Director of the United States Patent and Trademark Office*